(12) United States Patent
Myles

(10) Patent No.: US 6,380,737 B1
(45) Date of Patent: Apr. 30, 2002

(54) APPARATUS AND METHOD UTILIZING SAMPLE TRANSFER TO AND FROM NMR FLOW PROBES

(75) Inventor: Andrew Myles, Sunnyvale, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/903,343

(22) Filed: Jul. 10, 2001

(51) Int. Cl.[7] .................................. G01V 3/00
(52) U.S. Cl. ...................... 324/306; 324/309; 324/318; 324/321
(58) Field of Search ................ 324/306, 307, 324/309, 318, 319, 321

(56) References Cited

U.S. PATENT DOCUMENTS

| | | |
|---|---|---|
| 3,512,078 A | 5/1970 | Hall |
| 5,705,928 A | 1/1998 | Haner et al. |
| 6,177,798 B1 | 1/2001 | Haner et al. |

OTHER PUBLICATIONS

Poster by Sefler et al, entitled "Alternative Plumbing Schemes for Direct–Injection NMR", W & TH P 149, p. 271, 42nd Experimental Nuclear Magnetic Resonace Conference, Mar. 11–16, 2001, Orlando, Florida.

Isolated Valves and Pinch Valves description s heet from NR esearch Incorporated, p. 5, Jun. 1998.

*Primary Examiner*—Edward Lefkowitz
*Assistant Examiner*—Brij B. Shrivastav
(74) *Attorney, Agent, or Firm*—Bella Fishman; Andrei Popovici

(57) ABSTRACT

A bypass valve allows fast and reliable sequential transfer of samples from a 96-well plate to a flow-through nuclear magnetic resonance (NMR) probe of an NMR spectrometer. The bypass valve has three ports: an inject port connected to a first input of the flow-through probe; a load port connected to a needle capable of drawing the samples from the 96-well plate; and a hold port connected to a holding loop. The syringe pump draws a sample from the 96-well plate through the needle and the bypass valve into the holding loop. The position of the bypass valve is switched, and the sample and a dose of push solvent are pushed into the flow-through probe through the bypass valve. After NMR measurements are performed on the sample, the sample is drawn into the holding loop through the bypass valve, at the same time as air is flushed through the probe. The position of the bypass valve is again switched, and the sample is pushed out through the needle.

11 Claims, 1 Drawing Sheet

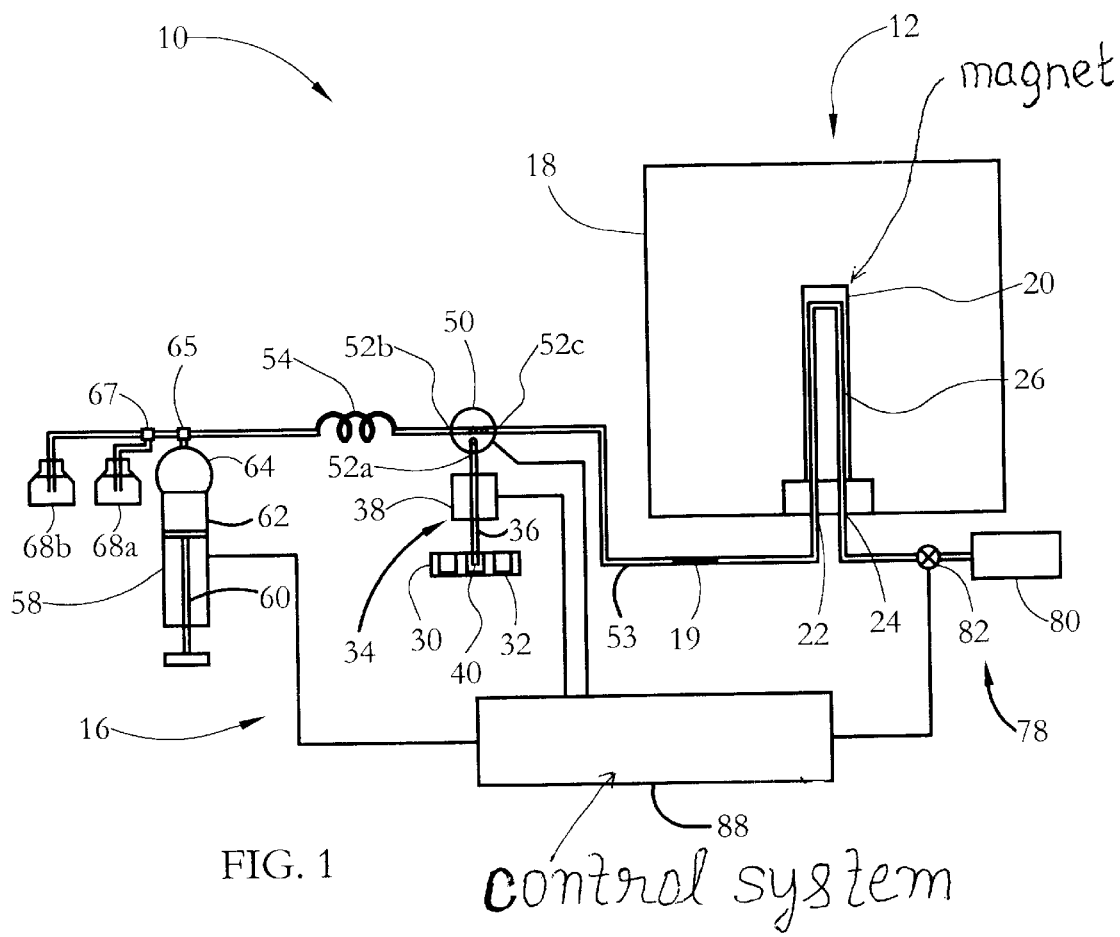
FIG. 1
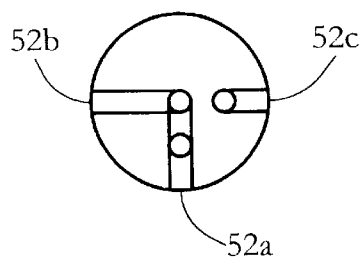
FIG. 2-A
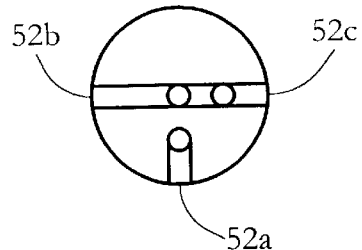
FIG. 2-B

APPARATUS AND METHOD UTILIZING SAMPLE TRANSFER TO AND FROM NMR FLOW PROBES

FIELD OF THE INVENTION

The invention in general relates to systems and methods for performing nuclear magnetic resonance (NMR) measurements, and in particular to systems and methods for delivering liquid NMR samples to and from flow-through NMR probes.

BACKGROUND OF THE INVENTION

A nuclear magnetic resonance (NMR) spectrometer typically includes a superconducting magnet for generating a static magnetic field $B_0$, and an NMR probe positioned in a longitudinal bore of the magnet. The NMR probe includes one or more coils for applying RF magnetic fields $B_1$ to a set of samples of interest, and for recording the response of the samples to the applied magnetic fields. The samples of interest are inserted one at a time in the NMR probe, and NMR measurements are performed on each sample. The samples of interest are typically in liquid form.

Conventional NMR probes include stationary-sample probes and flow-through probes. In stationary-sample NMR, each sample is placed in an individual tube or vial. The vial is inserted into the NMR probe, and measurements are performed on the sample. The sample may be spun around the cylinder axis of the tube, in order to improve the resolution of the performed measurements. After desired measurements are performed on the sample, the tube is taken out of the probe and a new tube is inserted. For a description of a conventional system suitable for inserting and ejecting samples tubes from an NMR spectrometer see for example U.S. Pat. No. 3,512,078.

In flow-through NMR, the NMR probe includes a sample inlet, a sample outlet, and internal tubing extending between the inlet and outlet. The internal tubing includes a flow cell for holding the sample during a measurement. Samples are sequentially inserted into the NMR probe and flow through the internal tubing. After a measurement is performed on a sample, the sample is taken out of the probe through the tubing, and a new sample is inserted. For a description of a flow-through NMR probe see for example U.S. Pat. No. 6,177,798.

Conventionally, a robotic sample delivery system is used to deliver each NMR sample to an NMR flow probe. Sample delivery systems are commercially available, for example from Gilson, Inc. Such a system includes a robotic arm which positions a needle to a desired well of a 96-well plate containing a plurality of samples to be tested. The needle draws a desired sample into a holding loop. The robotic arm then moves the needle to an inject port connected to the flow-through NMR probe. The sample is pushed through the inject port into the flow-through NMR probe, and is taken out of the probe through the inject port after NMR measurements have been performed on the sample. The needle is moved to a different well of the 96-well plate, and the process described above is repeated for other samples held in the 96-well plate. Such a conventional system for delivering samples to a flow-through NMR probe can suffer from limited throughput and reliability problems.

SUMMARY OF THE INVENTION

The present invention provides systems and methods for performing nuclear magnetic resonance (NMR) measurements on liquid NMR samples, and for delivering the NMR samples to flow-through NMR probes of NMR spectrometers. The systems include a bypass valve capable of alternatively connecting a sample transfer conduit to a temporary sample holding reservoir, and the temporary sample holding reservoir to an inlet port of an NMR probe. In a load position, the bypass valve connects the sample transfer conduit to the temporary holding reservoir. In an inject position, the bypass valve connects the temporary holding reservoir to the inlet port of the NMR probe. The bypass valve allows the use of relatively simple and compact fluidic components for fast and reliable loading of NMR samples into the NMR probe.

In particular, the present invention provides an apparatus for performing nuclear magnetic resonance measurements comprising: a magnet; a flow-through nuclear magnetic resonance probe positioned in a bore of the magnet, the probe including an inlet port for sequentially receiving the samples, a flushing port, and internal sample tubing connecting the inlet port and the flushing port; a push solvent reservoir for holding a push solvent; a sample transfer device including a movable sample transfer conduit capable of sequential fluidic communication with a plurality of sample containers, each of the sample containers holding one of the samples; a bypass valve capable of switching between a load position and an inject position as described above; a bi-directional pump fluidically connected between the push solvent reservoir and the temporary sample holding reservoir; a temporary sample holding reservoir fluidically connected between the pump and the bypass valve; a flushing device fluidically connected to the flushing port of the probe; and control electronics electrically connected to the pump, the bypass valve, and the flushing device, for controlling the operation of the apparatus as described below.

The sample transfer conduit is positioned within a desired sample container. The pump draws a dose of liquid push solvent from the push solvent reservoir, and draws a selected NMR sample from a corresponding sample container into the temporary sample holding reservoir. During the loading step, the bypass valve is set to the load position, and the sample passes through the sample transfer conduit and the bypass valve. The bypass valve is then set to the inject position, and the pump injects the sample and the dose of push solvent through the temporary sample holding reservoir and the bypass valve into the inlet port of the probe.

As the sample is held within the probe, the magnet applies a magnetic field to the sample and NMR measurements are performed on the sample. After the measurements are completed, the flushing device provides a pressurized flushing fluid to the flushing port of the probe and the pump draws liquid from the probe, to flush the sample and the push solvent out of the probe through the inlet port of the probe. The sample is transferred into the temporary sample holding reservoir while the bypass valve is in the inject position, and then pushed out through the sample transfer device while the bypass valve is in the load position. The steps described above are achieved through the use of appropriate control signals sent by the control electronics to the sample transfer device, pump, bypass valve, and flushing device.

BRIEF DESCRIPTION OF THE DRAWINGS

The foregoing aspects and advantages of the present invention will become better understood upon reading the following detailed description and upon reference to the drawings where:

FIG. 1 is a schematic diagram of an apparatus for performing nuclear magnetic resonance (NMR) measurements according to the preferred embodiment of the present invention.

FIG. 2-A shows a schematic diagram of a bypass valve of the apparatus of FIG. 1 in a load position, according to the present invention.

FIG. 2-B shows a schematic diagram of the bypass valve of FIG. 2-A in an inject position, according to the present invention.

DETAILED DESCRIPTION OF THE INVENTION

In the following description, any recited fluidic connection between a first element and a second element encompasses direct connections between the first and second elements, and indirect connections through intermediary structures such as tubing or valves disposed between the first and second elements. Any recited element is understood to refer to at least one element. A set of elements is understood to include one or more elements. The term "tubing" is understood to encompass any fluid conduit, and is not generally limited to conduits having circular cross-sections. The statement that an operation is performed sequentially on a plurality of samples is understood to mean that the operation is performed on one sample at a time. Unless otherwise specified, the terms "pump" and "pump system" are understood to encompass single pumps as well as two or more pumps.

The following description illustrates embodiments of the invention by way of example and not necessarily by way of limitation.

FIG. 1 is a schematic diagram illustrating an apparatus for performing nuclear magnetic resonance (NMR) measurements 10 according to the preferred embodiment of the present invention. Apparatus 10 comprises a conventional NMR spectrometer 12, and a flow-through NMR sample delivery system 16 for sequentially delivering multiple liquid NMR samples to spectrometer 12, and for retrieving the samples from spectrometer 12.

Spectrometer 12 comprises a magnet 18 for applying a static longitudinal magnetic field $B_0$ to each sample of interest, and a flow-through NMR probe 20 positioned in a bore of magnet 18. Probe 20 is fluidically connected to sample delivery system 16, for receiving and sending the NMR samples to and from sample delivery system 16. FIG. 1 shows an exemplary NMR sample 19 flowing toward probe 20.

Probe 20 has a sample inlet port 22, a sample flushing port 24, and internal sample tubing 26 extending between and connecting sample ports 22, 24. Each sample port 22, 24 is connected to sample delivery system 16, as explained in further detail below. Sample tubing 26 includes a conventional NMR flow cell having a sample analysis area positioned centrally within magnet 18, for holding each NMR sample as NMR measurements are performed on the sample. In present implementations, the volume of the sample analysis area and of each NMR sample to be analyzed can be 60 l or 120 l. Probe 20 includes one or more radio-frequency (RF) coils for applying radio-frequency transverse magnetic fields $B_1$ to the samples of interest, and/or for measuring the response of the samples to the applied magnetic fields.

Sample delivery system 16 comprises a multi-container sample holder 30 for holding a plurality of liquid NMR samples, and components for sequentially transferring the NMR samples to and from probe 20 for measurements. Sample holder 30 has a plurality of sample containers or wells 32. Each container 32 holds one of the NMR samples to be analyzed, and has an opening along its top surface for allowing access to its contents. In a present implementation, sample holder 30 is a conventional 96-well plate.

A movable sample transfer (drawing) device 34 is positioned facing the openings of sample containers 32, for sequentially transferring the NMR samples to and from sample containers 32. Sample transfer device 34 includes a sample transfer conduit such as a needle 36 mounted on a movable robotic arm 38. Needle 36 has a distal opening 40 for accessing sample containers 32. Needle 36 is capable of accessing any one sample container 32 at a time, according to the motion of arm 38. Arm 38 can move needle 36 along the x- and y-(horizontal) directions, and can lower needle 36 into any selected one of sample containers 32.

A three-port bypass valve 50 is mounted at the proximal end of transfer device 34, and is fluidically connected to sample transfer device 34 opposite distal opening 40. Bypass valve 50 has a load port 52a, a hold port 52b, and an inject port 52c. Load port 52a is fluidically connected to needle 36, for sending and receiving liquid to/from containers 32 through needle 36. Inject port 52c is fluidically connected to the first sample port 22 of probe 20 through probe input tubing 53.

Bypass valve 50 is capable of switching between a load position and an inject position, as illustrated in FIGS. 2-A and 2-B, respectively. In the load position, shown in FIG. 2-A, load port 52a is connected to hold port 52b, while inject port 52c is not connected to the other two ports. In the inject position, shown in FIG. 2-B, hold port 52b is connected to inject port 52c, while load port 52a is not connected to the other two ports.

Bypass valve 50 preferably has substantially zero dead volume. If the dead volume of bypass valve 50 is not much smaller than the volume of each sample, multiple rinsing cycles of delivery system 16 and probe 26 may be needed to prevent sample cross-contamination. The switching time of bypass valve 50 can be order of tens to hundreds of milliseconds, for example 20–30 ms. The port diamaters of bypass valve 50 can be on the order of millimeters, for example about 1.5 mm. The interior of bypass valve 50 is preferably lined with tetrafluoroethylene (TFE) or another inert and mechanically stable material, to prevent reactions with the fluids passing through bypass valve 50 and changes in the interior shape (e.g. swelling) of bypass valve 50. Suitable bypass valves are commercially available, for example from NResearch Inc., West Caldwell, N.J.

Referring back to FIG. 1, a temporary sample holding reservoir such as a holding loop 54 is connected to hold port 52b. The internal volume of holding loop 54 is sufficiently large to hold each NMR sample. Holding loop 54 serves to temporarily store each NMR sample and allow the passage of push solvent, as described in more detail below.

A bidirectional fluidic driving device or system such as a syringe pump 58 is fluidically connected to holding loop 54 through a pump input/output selection valve 65. Selection valve 65 can be provided as part of syringe pump 58. Syringe pump 58 is connected to holding loop 54 at the end of holding loop opposite hold port 52b of bypass valve 50. Syringe pump 58 comprises a pump housing 62, and a plunger 60 capable of bidirectional motion within pump housing 62. A liquid storage chamber 64 is defined within pump housing 62, for storing push solvent drawn by the motion of plunger 60, as explained in more detail below. Through the motion of plunger 60, syringe pump 58 can drive the flow of liquid through the internal tubing of system 16 in either direction relative to syringe pump 58. The motion of plunger 60 generates pressure gradients which drive the motion of each NMR sample and corresponding dose of push solvent through sample delivery system 16 and NMR probe 20, to and from NMR probe 20. The motion of plunger 60 can be sufficiently accurately controlled to allow the precise positioning of each NMR sample within the flow cell of NMR probe 20. Preferably, the motion of plunger 60 is precalibrated to ensure the accurate positioning of each sample within the flow cell.

A set of push solvent reservoirs 68a–b each containing a distinct push solvent is fluidically connected to syringe pump 58 through pump selection valve 65, for providing push solvent to syringe pump 58. A solvent selection valve 67 is disposed between pump selection valve 65 and solvent reservoirs 68a–b, for selectively connecting only one of reservoirs 68a–b to pump selection valve 65. Reservoir 68 and syringe pump 58 are connected by tubing having an inlet end inserted in the push solvent of solvent reservoir 68, and an outlet end coupled to syringe pump 58. Push solvent drawn from solvent reservoir 68 serves to push each NMR sample through the tubing of sample delivery system 16 and NMR probe 20.

A flushing device 78 is connected to sample port 24, for providing a pressurized flushing fluid to sample port 24. The flushing fluid flushes the samples and push solvent out of probe 20 and the internal tubing of sample delivery system 16. Flushing device 78 can include a gas source 80, and a two-port gas valve 82 connecting gas source 80 and sample port 24. Gas source 80 preferably includes a connection to an in-building air compressor. Gas source 80 can also include an air or nitrogen tank, or a compressor itself. In a present implementation, gas source 80 is preferably capable of providing 50–68 psi of air to sample port 24. The flushing fluid is preferably a gas rather than a liquid, in order to minimize any mixing of the flushing fluid with the sample under analysis in the flow cell of probe 26.

A control system (control electronics) 88 is electrically connected to syringe pump 58, pump selection valve 65, solvent selection valve 67, arm 38, bypass valve 50, and gas valve 82, for controlling the operation of sample delivery system 16. Control system 88 is also connected to the control electronics of spectrometer 12. Control system 88 can be implemented using any suitable combination of hardware and software. For example, control system 88 can include an appropriately programmed general-purpose computer, or dedicated special-purpose hardware. Control system 88 controls the operation of sample delivery system 16 as described in detail below.

Referring to FIG. 1, solvent selection valve 67 and pump selection valve 65 are set to connect container 68a to chamber 64. Syringe pump 58 is controlled to draw a dose of push solvent from a selected container, for example container 68a, into chamber 64. Bypass valve 50 is set to the load position illustrated in FIG. 2-A, while pump selection valve 65 is set to connect chamber 64 to holding loop 54. Push solvent is normally present at this time within holding loop 54, bypass valve 50, and needle 36. Arm 38 is then controlled to position needle 36 above a desired sample well 32. Needle 36 is lowered into the desired well, and syringe pump 58 is controlled to draw a sample from the well into holding loop 54. The proximal edge of the sample abuts the push solvent.

Bypass valve 50 is then set to the inject position illustrated in FIG. 2-B for a subsequent sample injection step. Referring back to FIG. 1, syringe pump 58 pushes the sample and a corresponding dose of push solvent through bypass valve 50 and inlet port 22 into probe 20. The motion of plunger 60 is stopped at a precalibrated position corresponding to an optimal placement of the sample within probe 20. Spectrometer 12 is then used to apply suitable static and RF magnetic fields to the sample, and to record the response of the sample to the applied magnetic fields.

After measurements are performed on the sample, gas valve 82 is opened. The sample and push solvent are drawn back through bypass valve 50 and into holding loop 54 by the air pressure generated by gas source 80 and the action of syringe pump 58. Bypass valve 50 is then set again to its load position. Needle 36 is positioned in a desired well 32, and the used sample is pushed by syringe pump 58 through bypass valve 50 into the desired well 32. Alternatively, needle 36 can be moved to a rinse station instead of a well 32. The fluidics of system 16 and probe 20 can be then rinsed at a rinse station. If a different push solvent (e.g. the solvent present in container 68b) is to be used for subsequent samples, that solvent can also be used to rinse the fluidics of system 16 and probe 20 prior to the loading of the subsequent samples.

The above described systems and methods allow improved throughputs relative to conventional systems that require a needle to move between a sample container and an inject port of the NMR probe after the sample is drawn from the sample container. The bypass valve reduced unnecessary forward and backward motions of the robotic arm holding the needle. Such motions ordinarily take on the order of a few seconds. The time saved by eliminating such motions can be significant relative to the total amount of time required to analyze a sample. The total time per sample depends on the particular NMR application and measurements required, but generally varies between seconds and tens of seconds.

The above described systems and methods also allow for improved sample delivery reliability, by removing the need for forming a new seal between the needle and a fixed inject port of the probe each time a new sample is inserted into the probe. In a system in which the needle is moved between the sample containers and a fixed inject port of the probe, the seal formed between the needle and the inject port may fail, thus allowing air to be sucked into the holding loop when the sample is retrieved from the probe. Moreover, the quality of the seal formed between the needle and the inject port in such a system may limit the flow rates through the needle, in order not to breach the seal between the needle and the inject port.

In addition, the systems and methods described above allow an increase in the lifespan of the robotic arm holding the needle, and allow the use of relatively few and simple fluidic components to provide fast and reliable sample delivery. The use of simple fluidics is advantageous because it leads to reduced costs and improved reliability. Moreover, the systems and methods described above allow the use of shorter tubing than corresponding systems requiring additional motion of the needle and robotic arm between the sample containers and an inject port of the probe. Shorter tubing allows a reduction in the amount of push solvent that needs to be flushed out when the push solvent is switched.

A suitable sample delivery system according to the present invention can be built by modifying a Gilson 215 liquid handler available from Gilson Inc. A Gilson 215 liquid handler can be modified by adding and connecting a bypass valve as described above, and appropriately designing the software controlling the operation of the liquid handler to achieve the operating steps designed above.

It will be clear to one skilled in the art that the above embodiments may be altered in many ways without departing from the scope of the invention. Any recited pump or fluidic driving device can include two or more independent pumps instead of a single bi-directional pump to drive the fluid flow toward and from the NMR probe. The two pumps can be alternatively or commonly connected to the sample delivery system tubing. Additional tubing and valves can be inserted within the sample delivery system. Accordingly, the scope of the invention should be determined by the following claims and their legal equivalents.

What is claimed is:

1. An apparatus for performing nuclear magnetic resonance measurements, comprising:
   a) a magnet for applying a magnetic field to a plurality of nuclear magnetic resonance samples;
   b) a flow-through nuclear magnetic resonance probe positioned in a bore of the magnet, the probe including a first port for sequentially receiving the samples, a second port, and internal sample tubing connecting the first port and the second port, for sequentially holding the samples as nuclear magnetic resonance measurements are performed on the samples;
   c) a push solvent reservoir for holding a push solvent;
   d) a movable sample transfer conduit capable of sequential fluidic communication with a plurality of sample containers each holding one of the samples, for sequentially drawing the samples from the sample containers;
   e) a temporary sample holding reservoir for sequentially holding the samples and for sequentially transferring the samples and push solvent;
   f) a bypass valve capable of switching between a load position and an inject position, the bypass valve comprising
      a hold port fluidically connected to the temporary sample holding reservoir,
      a load port fluidically connected to the sample transfer conduit, and
      an inject port fluidically connected to the first port of the probe;
      wherein
         in the load position, the bypass valve connects the load port and the hold port, for allowing a sequential transfer of the samples between the sample transfer conduit and the temporary sample holding reservoir, and
         in the inject position, the bypass valve connects the hold port and the inject port, for allowing a sequential transfer of the samples and push solvent between the temporary sample holding reservoir and the first port of the probe;
   g) a bi-directional pump fluidically connected to the temporary sample holding reservoir opposite the bypass valve, and connected to the push solvent reservoir, for sequentially drawing push solvent from the push solvent reservoir, for driving the sequential transfer of the samples between the sample transfer conduit and the temporary sample holding reservoir, and for driving the sequential transfer of the samples and push solvent between the temporary sample holding reservoir and the first port of the probe;
   h) a flushing gas source fluidically connected to the second port of the probe, for providing a pressurized flushing gas to the second port of the probe to sequentially flush the samples out of the probe through the first port of the probe; and
   i) control electronics electrically connected to the bidirectional pump, the bypass valve, and the flushing gas source, for
      controlling the bi-directional pump to sequentially draw push solvent from the push solvent reservoir,
      controlling the bidirectional pump to drive a sequential loading of the samples from the sample containers through the bypass valve into the temporary sample holding reservoir as the bypass valve is set in the load position,
      controlling the bi-directional pump to drive a sequential injection of the samples from the temporary sample holding reservoir through the bypass valve and into the first port of the probe as the bypass valve is set in the inject position, and
      controlling the flushing gas source to drive a sequential flushing of the samples from the probe through the first port of the probe.

2. The apparatus of claim 1, wherein the control electronics sets the bypass valve in the load position during the flushing of the samples from the probe, for sequentially flushing the samples into the temporary sample holding reservoir.

3. The apparatus of claim 2, wherein the control electronics further controls a sequential discharge of the samples from the temporary sample holding reservoir through the bypass valve and the sample transfer device as the bypass valve is set in the load position.

4. An apparatus for sequentially delivering a plurality of nuclear magnetic resonance samples to a flow-through nuclear magnetic resonance probe, comprising:
   a) a sample transfer conduit capable of sequential fluidic communication with a plurality of sample containers each holding one of the samples, for sequentially drawing the samples from the sample containers;
   b) a temporary sample holding reservoir for sequentially holding the samples;
   c) a bypass valve capable of switching between a load position and an inject position, the bypass valve comprising
      a hold port fluidically connected to the temporary sample holding reservoir,
      a load port fluidically connected to the sample transfer conduit, and
      an inject port fluidically connected to an inlet port of the probe;
      wherein
         in the load position, the bypass valve connects the load port and the hold port, for allowing a sequential transfer of the samples between the sample transfer conduit and the temporary sample holding reservoir, and
         in the inject position, the bypass valve connects the hold port and the inject port, for allowing a sequential transfer of the samples between the temporary sample holding reservoir and the inlet port of the probe; and
   d) a pump system fluidically connected to the sample transfer conduit, for driving the sequential transfer of the samples between the sample transfer conduit and the temporary sample holding reservoir, and for driving the sequential transfer of the samples between the temporary sample holding reservoir and the inlet port of the probe.

5. The apparatus of claim 4, further comprising a source of flushing fluid fluidically connected to a flushing port of the probe, for providing a pressurized flushing fluid to the flushing port of the probe to sequentially flush the samples out of the probe through the inlet port of the probe, the flushing port being connected to the inlet port through internal probe tubing.

6. The apparatus of claim 4, wherein the pump system is capable of driving a sequential flushing of the samples from the probe into the temporary sample holding reservoir through the bypass valve as the bypass valve is set in the inject position, and from the temporary sample holding reservoir to the sample transfer conduit through the bypass valve as the bypass valve is set in the load position.

7. An apparatus for performing nuclear magnetic resonance measurements, comprising:
   a) a magnet for applying a magnetic field to a plurality of nuclear magnetic resonance samples;
   b) a flow-through nuclear magnetic resonance probe positioned in a bore of the magnet, the probe including a first port for sequentially receiving the samples, a second port, and internal sample tubing connecting the first port and the second port, the internal sample tubing including a flow cell for sequentially holding the samples as nuclear magnetic resonance measurements are performed on the samples;
   c) a sample transfer conduit capable of sequential fluidic communication with a plurality of sample containers each holding one of the samples, for sequentially drawing the samples from the sample containers;
   d) a temporary sample holding reservoir for sequentially holding each of the samples after said each of the samples is drawn by the sample transfer device from the sample containers; and
   e) a bypass valve capable of switching between a load position and an inject position, the bypass valve comprising
      a load port fluidically connected to the sample transfer conduit,
      a hold port fluidically connected to the temporary sample holding reservoir, and
      an inject port fluidically connected to the probe input tubing;
      wherein,
         in the load position, the load port is fluidically connected to the hold port, for allowing said each of the samples to pass from the sample transfer conduit to the temporary sample holding reservoir; and
         in the sample delivery position, the hold port is fluidically connected to the inject port, for allowing said each of the samples to pass from the sample holding reservoir to the probe input tubing.

8. An apparatus for sequentially delivering a plurality of nuclear magnetic resonance samples to a flow-through nuclear magnetic resonance probe, comprising:
   a) a sample drawing needle mounted on a movable arm, for sequentially drawing the samples from a multi-well sample holder;
   b) a holding loop for sequentially holding the samples;
   c) a bypass valve capable of switching between a load position and an inject position, the bypass valve comprising
      a hold port fluidically connected to the holding loop,
      a load port fluidically connected to the sample drawing needle, and
      an inject port fluidically connected to an inlet port of the probe;
      wherein
         in the load position, the bypass valve connects the load port and the hold port, for allowing a sequential transfer of the samples from the sample drawing needle into the holding loop, and
         in the inject position, the bypass valve connects the hold port and the inject port, for allowing a sequential transfer of the samples from the holding loop to the inlet port of the probe; and
   d) a syringe pump fluidically connected to the sample drawing needle, for driving the sequential transfer of the samples from the sample drawing needle into the holding loop as the bypass valve is set to the load position, and for driving the sequential transfer of the samples from the holding loop to the inlet port of the probe as the bypass valve is set to the inject position.

9. The apparatus of claim 8, further comprising a flushing gas source fluidically connected to a flushing port of the probe, for providing a pressurized flushing gas to the flushing port of the probe to sequentially flush the samples out of the probe through the inlet port of the probe, the flushing port being connected to the inlet port through internal probe tubing.

10. A method of transferring a plurality of samples to a nuclear magnetic resonance probe, comprising the steps of:
    a) drawing each of the samples from a corresponding sample container into a temporary holding reservoir through a bypass valve set in a load position;
    b) injecting said each of the samples from the temporary holding reservoir to an inlet port of the probe through the bypass valve set in an inject position;
    c) flushing fluid to a flushing port of the probe, the flushing port being connected to the inlet port through internal probe tubing, for flushing said each of the samples out of the probe through the inlet port, and
    d) performing a nuclear magnetic resonance measurement on said each of the samples as said each of the samples is held within the probe.

11. An apparatus for sequentially delivering a plurality of nuclear magnetic resonance samples to a flow-through nuclear magnetic resonance probe, comprising:
    a) sample transfer means capable of sequential fluidic communication with a plurality of sample containers each holding one of the samples, for sequentially drawing the samples from the sample containers;
    b) temporary sample holding means for sequentially holding the samples;
    c) bypass means capable of switching between a load position and an inject position, wherein
       in the load position, the bypass means connects the sample transfer means to the temporary sample holding means, for allowing a sequential transfer of the samples between the sample transfer means and the temporary sample holding means, and
       in the inject position, the bypass means connects the temporary sample holding means to the probe, for allowing a sequential transfer of the samples between the temporary sample holding means and the probe; and
    d) pump means fluidically connected to the sample transfer means, for driving the sequential transfer of the samples between the sample transfer means and the temporary sample holding means, and for driving the sequential transfer of the samples between the temporary sample holding means and the probe.

* * * * *